United States Patent [19]

Chen

[11] 4,128,894
[45] Dec. 5, 1978

[54] BUBBLE DOMAIN CIRCUIT ORGANIZATION

[75] Inventor: Thomas T. Chen, Yorba Linda, Calif.

[73] Assignee: Rockwell International Corporation, El Segundo, Calif.

[21] Appl. No.: 806,419

[22] Filed: Jun. 14, 1977

[51] Int. Cl.² ............................................ G11C 19/08
[52] U.S. Cl. ...................................... 365/4; 365/12; 365/14
[58] Field of Search ............... 340/174 TF; 365/4, 12, 365/15

[56]  References Cited
U.S. PATENT DOCUMENTS 4,032,905  6/1977  Chen .......................................... 365/4

OTHER PUBLICATIONS

IEEE Transactions on Magnetics–vol. Mag-12, No. 4, pp. 411–413, Jul. 1976.
IEEE Transactions on Magnetics–vol. Mag-12, No. 6, Nov. 1976, pp. 630–632.

Primary Examiner—James W. Moffitt
Attorney, Agent, or Firm—H. Fredrick Hamann; G. Donald Weber, Jr.

[57] ABSTRACT

The disclosed chip design is directed to a multiplexed decoder chip with $M \geq 2$. With this arrangement magnetic bubble domains are propagating at one data bit every M cycles (for M = 2 this is every other cycle). Therefore, a unique decoder network using an existing retarding switch can be realized to offer a lower power, highly efficient multiplexed decoder chip with complete selective read-write capability.

16 Claims, 4 Drawing Figures

BUBBLE DOMAIN CIRCUIT ORGANIZATION

The invention is directed to an on-chip bubble domain circuit organization. One or more storage registers are connected to a propagation path whereby data in the form of magnetic bubble domains (bubbles) may be transferred into and out of the storage registers. The propagation path includes a generator for producing the initial bubbles which may be expanded into any desired number of new bubbles by a multiple output replicator. An input decoder is utilized to determine to which storage register the bubbles from the replicator will be directed along the propagation path. Those bubbles not selected may be discarded. The selected bubbles are transferred into the respective storage registers and, typically, propagated therethrough.

The storage register includes a transfer switch which transfers bubbles to a separate output propagation path. The output propagation path substantially parallels a portion of the storage register. However, the output propagation path and the parallel portion of the storage register differ in length by a prescribed distance, e.g. one bubble period.

An output decoder, utilizing essentially the same decoding scheme as the input decoder, selectively operates upon bubbles in the output propagation paths of the storage registers. The output decoder retards all of the bubbles from certain storage registers so that only the information from the selected storage register is unretarded. A transfer and replicate switch is provided in the output propagation path of the storage register between the output decoder and the multiple input detector. The switch selectively transfers or replicates bubbles from the output propagation path to the detector. The detectors, in turn, produce the chip output signal. External control electronics are utilized to control the selective operation of the various devices utilized in the propagation path.

In the event the switch replicates bubbles and returns same to the storage register, a delay switch is provided. The delay switch, coupled with the difference in length between the parallel portions noted above, permits synchronized reinsertion of the bubbles into the storage register. All the bubbles in the nonselected output propagation paths are returned to the storage registers in a similar fashion.

BACKGROUND OF THE INVENTION

1. Field of the Invention

This invention relates to a magnetic bubble domain chip and, more particularly, to a chip organization utilizing a unique output decoder and output path arrangement.

2. Description of the Prior Art

In the prior art bubble domain systems, compromises are frequently made with ideal operating conditions. For example, high power requirements are accepted in order to achieve desired access rates. Also, low capacity is accepted to achieve low power consumption. Complexity is frequently endured in order to obtain storage capacity. Other trade-offs are often made. Therefore, it is highly desirable to provide a bubble domain chip organization which maximizes all of these attributes especially by means of multiplexing of storage areas.

The on-chip decoding organization approach has been found to enjoy an advantage of faster access time over other systems such as the serial or major-minor loop organization. The slower access time of known systems is normally attributed to designs that require all blocks of information to be arranged in series, thus requiring the blocks to be rotated, in sequence, to the input/output port. The known systems generally also require data which has been read to be recycled back into the minor loops which lengthens and further complicates the read operation.

In some known organizations, blocks of information are arranged in parallel whereby longer access time and discontinuous data readout can be substantially overcome. However, in the past, the requirement of decoder lines including switches and passive annihilators in the chip designs, as suggested by H. Chang et al, have been plagued with margin overlap of the decoder switch (transfer type) and the passive bubble annihilator. This problem substantially reduces the effectiveness of the existing decoder organization schemes. Moreover, the problems noted supra relative to power, heat and the like are encountered in output decoders too.

The decoder using annihilating type switches proposed in U.S. Pat. No. 4,032,905, Bubble Domain Circuit Organization by Chen, has wide operating margin but requires large operating power. Thus, this organization is not suitable for very large capacity chips. A decoder network using retarding switches has been proposed by Bonyhard et al, "Device Design and System Organization for a Decoder Accessed Magnetic Bubble Memory," AIP Conference Proceedings, No. 18, pt. 1, pp. 100-104. This network has very good operating margin. However, the organization described has all storage registers connected in series and, thus, has very slow clear/write time. Also, the serial system is vulnerable to any circuit defect. This organization again is not suitable for very large capacity chip design.

SUMMARY OF THE INVENTION

This invention relates to a magnetic bubble domain chip organization for parallel, block organized information which uses an improved output decoder scheme. A multiple output replicator can be used to substantially reduce the number of generators required in the chip organization by replicating the bubbles from the generator into any desired number of new bubble domains. A single generator arrangement is also contemplated.

Before the bubbles reach the respective storage registers, they are decoded by input decoder lines which retard all bubbles except the selected stream. Thus, only one bubble stream can be transferred into the selected storage register.

The output decoder is, preferably, associated with a modified storage register. That is, a parallel propagation path is provided relative to a portion of the storage register. Bubbles are selectively transferred to the parallel propagation path for output decoding. After decoding, the bubbles on the parallel propagation path are replicated with one bubble going to a detector and the other bubble being returned to the storage register. Suitable timing arrangements in terms of delay switches and path lengths permit synchronous return of the replicated bubbles to the storage register. All bubbles emanating from the respective registers are retarded by one bit time by the output decoder, except those selected. Only the information from the selected storage loop is transferred or replicated out and reaches the output detector for sensing purposes.

DETAILED DESCRIPTION OF THE PREFERRED EMBODIMENT

Figure 1:
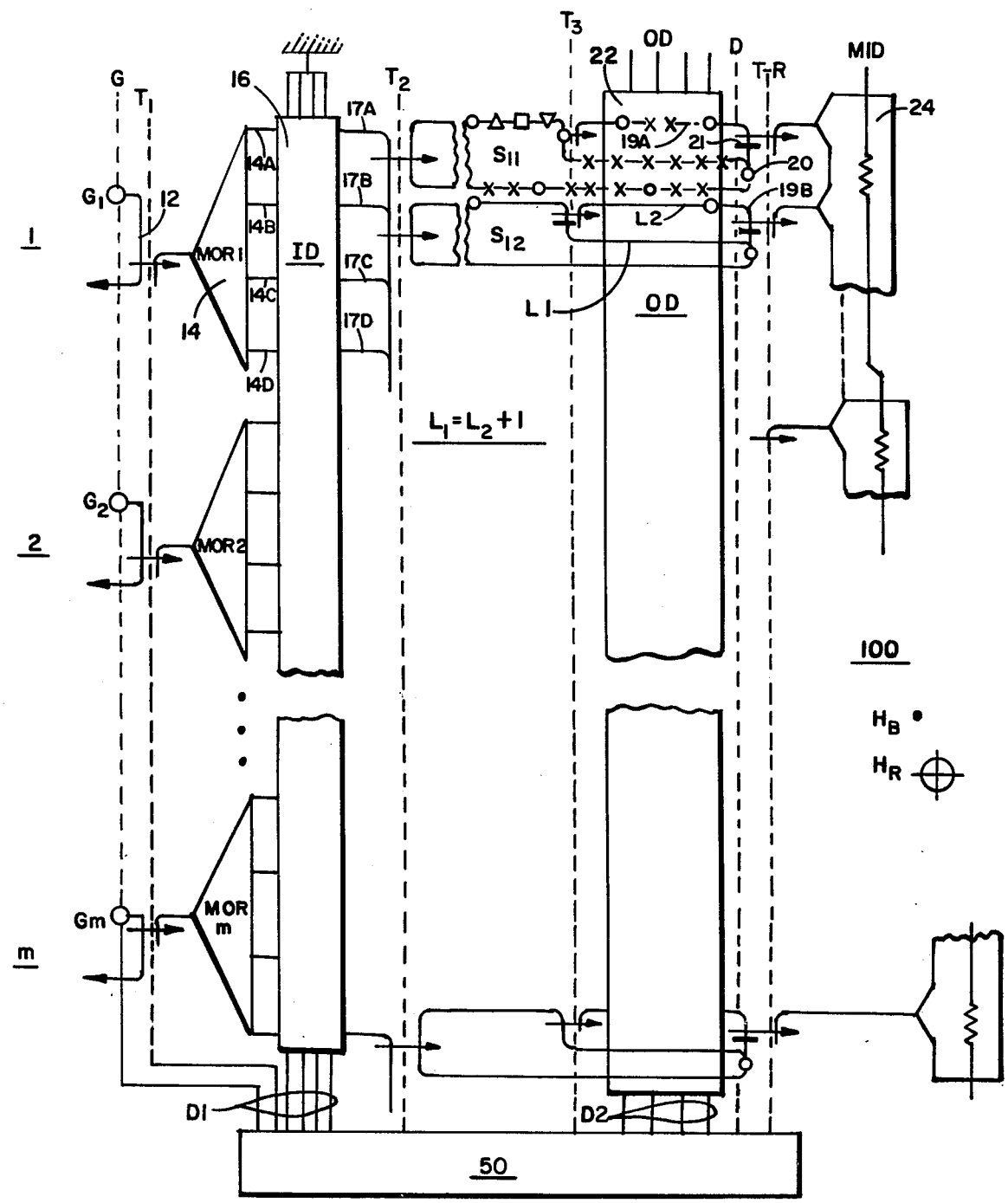
FIG. 1 is a block diagram of the chip organization contemplated by this invention.

Referring to FIG. 1, there is shown schematically, an illustrative magnetic bubble domain chip organization which provides writing, storing, decoding, clearing and sensing. Chip organization components are formed on magnetic sheet 100 which is fabricated of material suitable for forming bubble domains, such as garnet or orthoferrite. A bias field $H_B$ is applied normal to the plane of the magnetic sheet to produce magnetic bubble domains in sheet 100. In addition, a cyclically rotating field, $H_R$, which rotates in the plane of the magnetic sheet 100, is applied in a manner well known in the art to sequentially magnetize the components on sheet 100 to propagate bubble domains through sheet 100 in a controlled manner.

External control electronics 50 is any suitable device which is capable of producing the required conductor control current signals. The control electronics are connected to the chip to selectively produce the respective signals on the respective lines emanating therefrom.

A plurality of information channels, namely, channels 1, 2 . . . M are provided. Inasmuch as the channels are similar, only one channel is described in detail. A generator device identified as generator G1, G2 . . . GM, respectively, is utilized with each of the channels. The generators are of any suitable structure known in the art such as a disc or a loop generator. Generator G1 is connected to propagation path 12 of channel 1 and supplies bubbles to multiple output replicator 14 (MOR 1). In the embodiment shown, transfer switch T1 selectively transfers bubbles through propagation path 12. Replicator 14, in turn, replicates the bubbles from generator G1 into any desired number of bubbles which are applied to input decoder 16 along suitable propagation paths 14A, 14B and so forth. Four propagation paths 14A, 14B, 14C and 14D are shown for convenience. The number of propagation paths may be increased or decreased depending upon the number of storage registers 18 in the system. The multiple replication of bubbles, of course, is desirable in that the number of generator devices in the decoder chip is substantially reduced. Ultimately, this reduces the necessity of large quantities of power to nucleate bubbles.

Input decoder 16 is connected to propagation paths 14A–14D. Input decoder 16 is, typically, a retarding type decoder (although other decoders can be used) consisting of decoder lines which control the propagation of bubbles from paths 14A–14D to paths 17A–17D in response to the signals on lines D1 from control circuit 50.

Input decoder 16 is also connected to output propagation paths 17A, 17B, 17C and 17D, respectively. In essence, propagation paths 17 may be considered to be extensions of propagation paths 12. Each propagation path is connected to a respective storage register 18, identified as storage registers S11, S12, . . . S21, S22, . . . SMN (where M is the number of channels and N is the number of paths per channel). Typically, although not so limited, each path 17 is connected to a separate storage register 18 by suitable transfer switch T2 or the like. Each of the storage registers is a closed loop propagation path which may include a plurality of propagation path elements which are well known in the art.

Typically, all of the bubbles supplied to input decoder 16 via paths 14A to 14D (except a selected one path) may be retarded. Thus, information contained in the bubbles (e.g. binary information) is written into a selected storage loop.

Switches T3 are connected in series with the propagation paths in each of the storage loops, respectively. Each switch T3 comprises a replicate/transfer switch which is connected to receive the appropriate control signal (hereinafter referred to as the T3 signal) from controller 50. The switches selectively transfer magnetic bubble domains from the respective storage register loop to the associated parallel propagation paths 19A, 19B, . . . when energized by the T3 signal. The information on the parallel propagation paths is transferred through output decoder 22 as described hereinafter.

Parallel propagation paths 19 are returned to the associated storage register loop at merge 20 in the preferred embodiment. Data bubbles are transferred or replicated to the detector through transfer/replicator switch T/R for DRO or NDRO operation. A retarding switch 21 of known configuration, is used in conjunction with output decoder 22 in order to preserve synchronization of the information in the storage loop. Moreover, it is desirable, in the preferred embodiment described herein, to construct parallel propagation path 19 to have a length which is equal to one less bubble function (e.g. cycle of $H_R$) than the associated portion of the storage loop.

Output decoder 22 is similar to input decoder 16 in that the bubbles emanating from the storage registers may be retarded by one cycle in all but one propagation path 19. The operation of output decoder 22 is controlled by signals applied along line D2 from controller 50. Typically, the information in only the selected path from a particular storage loop will reach detector 24 to produce an output signal. When the information is stored in a block format, an entire block is thus detected. Detector 24 may be of any suitable configuration and may include a single detector or a plurality of smaller detectors connected in series.

A suitable output detector device (not shown) is connected to detector 24 to produce output signals in accordance with the operation of the detector. In a preferred embodiment, detector 24 may be connected as part of the guard rail that surrounds the system in some chip structure configurations.

In considering the operation of the chip, it is assumed that useful information is to be stored in the various storage registers. In order to store information in the respective storage registers, the fields $H_B$ and $H_R$ are applied and controlled 50 is made operative. The generator signal G produced by controller 50 is applied to all of the generators G1 through GM which produce magnetic bubble domains as is known in the art. (For convenience, only a single path is described). The magnetic bubble domains are propagated along path 12 to multiple output replicator 14. Replicator 14 produces (replicates) bubbles along propagation paths 14A through 14D. In response to signals on lines D1 from control circuit 50, input decoder 16 is rendered operative to permit bubbles to propagate along propagation paths 17A–17D from generator G1 such that a prescribed block of information is provided to the storage registers. A different arrangement of signals on lines D1 will permit the propagation of different bubbles along propagation paths 17A–17D, and so forth, such that another block of information is applied to the storage registers. Typically, the signals on lines D1 will cause input decoder 16 to shift all bubbles by one bit on the unselected propagation paths. Of course, bubbles are propagated along the appropriate number of propagation paths.

The bubbles from the propagation paths are then stored in the appropriate storage loops 18. The information in storage loops 18 circulates continuously around the loop in response to rotating field $H_R$.

Each storage loop or register 18 has an associated transfer/replicate switch T3. Each switch T3 is connected, in series with the other transfer/replicate switches, to controller 50. Switches T3 are activated by signal T3 whereby selected information in the respective storage registers 18 is replicated out of the storage loop into parallel propagation path 19. That is, when switches T3 are simultaneously pulsed by the application of the T3 signal from control circuit 50, the information in storage loops 18 is transferred to parallel propagation paths 19 (A–D). Parallel propagation paths 19 (A–D) propagate bubbles through output decoder 22. In accordance with the control signals D2 from control circuit 50, only certain bubbles are permitted to propagate along path 19 to detector 24 wherein the bubble information is detected. The unselected bubble information is, in a preferred embodiment, shifted.

Read-out of information from the storage registers may be accomplished either nondestructively or destructively. In the preferred mode of nondestructive readout (NDRO), switch T/R operates in the replicate mode and the information from parallel propagation path 19 is replicated to detector 24 and to storage loop 18.

In the non-destructive readout mode certain information is transferred from storage loop 18 via transfer switch T3, the application of the signal T3 by control circuitry 50. The elected bubbles are transferred to propagation path 19. Propagation path 19 passes through output decoder 23 and certain information therefrom is selected in accordance with the signals along the lines D2 from controller 50. The selected information is then replicated from propagation path 19 to detector 24 wherein the selected signals are then detected. In the selection process formed by output decoder 22, the bubbles propagating along parallel propagation path 19 are frequently delayed. Consequently, the portion of storage loop 18 which is in parallel with propagation path 19 is extended by the appropriate number of elements to establish a proper operation. In addition, a delay switch 21 can be included in path 19 to delay the bubbles passing through path 19 so that the bubble which is replicated by the switch TR will be reinserted into the bubble stream in storage loop 18 in the proper sequence.

Figure 2:
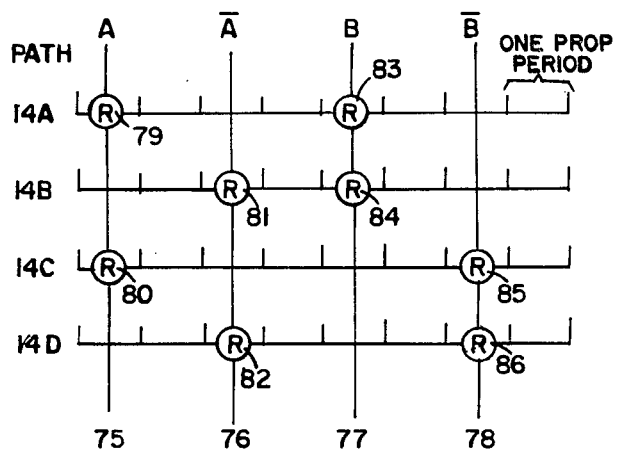
FIG. 2 is a generalized diagram illustrating a decoder organization utilized in this invention.

Referring now to FIG. 2, there is shown a generalized version of an output decoder 22 utilized in this invention. This decoder is based upon a retarder switch. The decoder utilizes a one or two level design wherein a conductor line directly crosses the propagation path connected with a gross aligned conductor overlay. Typically, decoder 22 includes a plurality of decoder lines 75, 76, 77 and 78 connected to receive signals from controller 50 (see FIG. 1). Each of the decoder lines includes one or more retarding components 79 through 86. Decoder line 75 includes retarders 79 and 80 located adjacent propagation paths 14A and 14C, respectively. Decoder line 76 includes retarders 81 and 82 adjacent propagation paths 14B and 14D, respectively. Likewise, decoder line 77 includes retarders 83 and 84 located in line with propagation paths 14A and 14B, respectively, while decoder line 78 incorporates retarders 85 and 86 therein adjacent paths 14C and 14D.

Typically, decoder lines 75–78 include relatively wide signal conductors and relatively narrow retarder components adjacent the propagation paths. The signal conductors are formed of suitable conductive material such as copper, aluminum, gold, chromium or alloys thereof, on the magnetic material. The conductors interconnect the retarder components which are formed of permalloy or the like over (or as part of) the propagation paths and connected between the spaced ends of the decoder line signal conductors. The retarder component is disposed adjacent to one end of the chevron group of the adjacent propagation path. Retarder switches or components are well-known in the art and are not described in detail herein.

When a current pulse is applied to a line, e.g. lines 75–77, those bubbles propagating under the retarding switch at that instant will be retarded by one bit time. Otherwise, the bubbles will not be affected by the decoder.

This decoder network is used in a multiplexed decoder organization, (see copending application by Chen et al, entitled Bubble Domain Circuit Organization, bearing Ser. No. 806,420 now U.S. Pat. No. 4,085,451 and filed on even date herewith) with multiplexing number $M \geq 2$. In other words, there are M time slots associated with each data bit. Therefore, in the decoder area, bubble propagation along 14A, 14B, 14C and 14D will be one data bit every M cycles. There is at least one empty space following every data enable which can accommodate the bubble being retarded by the retarding switch. All the control lines will be activated on a once every M cycles basis. All the decoder lines are laid out in every other period, (i.e. 75, 76, 77, 78 are all spaced 2 periods apart). Thus, when a bubble is delayed by one retarding switch it will never be retarded again by any other retarding switch in the network.

To achieve a binary decoding function, two complementary retarding decoder lines are required. For example, lines 75 and 76 form one pair, while lines 77 and 78 form another pair. The retarding switch distribution on line 75 complements that on line 76. If line 75 is activated (code A) those bubbles in paths 14A and 14C will be delayed by one bit but the bubbles on lines 14B and 14D will not be delayed. If line 76 is pulsed, then bubbles in paths 14B and 14D will be delayed — but not those in paths 14A and 14C. If both lines are activated at the same time then all bubbles will be retarded.

Lines 77 and 78 form a second pair for a second decoder function B and operate in the same manner. With two decoder functions, A and B, it is possible to decode four paths, 14A, 14B, 14C and 14D.

Figure 3:
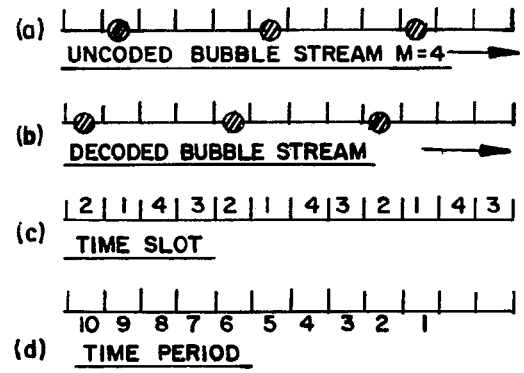
FIG. 3 is a diagram illustrating the timing relationships of the decoder shown in FIG. 2.

The operation of the decoder in FIG. 2 is better understood by referring to FIG. 3. In particular, line 3d shows the clock period for the system. The data arrangement is M = 4, with data (bubbles) every fourth time period, i.e. data bubbles will pass the first column of circuit elements in paths 14A–14D at time periods T = 1, 5, 9 ... If lines 75 and 77 are activated once every four cycles (i.e. code AB), the bubbles in path 14D will not be effected as shown in FIG. 3(a), (i.e. the bubbles still remain at time slot 1), but bubbles in paths 14A, B, C will be delayed to time slot 2 as shown in FIG. 3(b). If the transfer switch T2 (see FIG. 1) is activated at time slot 1, the bubble stream in path 14D (or 17D) can be transferred to the storage loop S14. The bubbles in paths 14A, 14B and 14C or 17A, 17B and 17C will be merged and replicated out of the chip.

Because the bubbles are decoded by changing the positions thereof in the time slot associated with each data bit, there are at least two time slots required for each data bit or $M \geq 2$. If $M = 2$, all the decoder lines have to be separately accessed as shown in FIG. 2. However, if $M \geq 4$, a certain degree of lead sharing can be made according to the guide lines shown in Chen et al supra. For example, if $M = 4$ then complementary lines 75, 76 and 77 and 78 can be connected in series to form two lines. In this instance, retarders 79–82 are connected in series and so are retarders 83–86. If these lines are pulsed at time slot 1 (at this time assume bubbles are propagating in the first column of 14A-D), retarders 79 and 80 are functioning. Although retarders 81 and 82 are also activated, the bubble in paths 14B and 14D in in the first column and, thus, are not affected. Therefore, a pulse at time slot 1 is equivalent to a function A. If the control pulse is applied at time slot 3, the retarders 81 and 82 function to produce a code of $\overline{A}$.

If M is greater than 8, further lead sharing can be made between these decoder lines. In an example for $M = 8$, retarders 79 and 83, 81 and 84, 80 and 85, as well as 82 and 86 are connected in parallel. The parallel retarder arrangements are connected in series with a single control line. Conversely, all of the retarders can be connected in series with a single control line corresponding to decoding functions A, $\overline{A}$, B, $\overline{B}$, respectively. All of the specific control conductor arrangements are not shown, per se.

Figure 4:
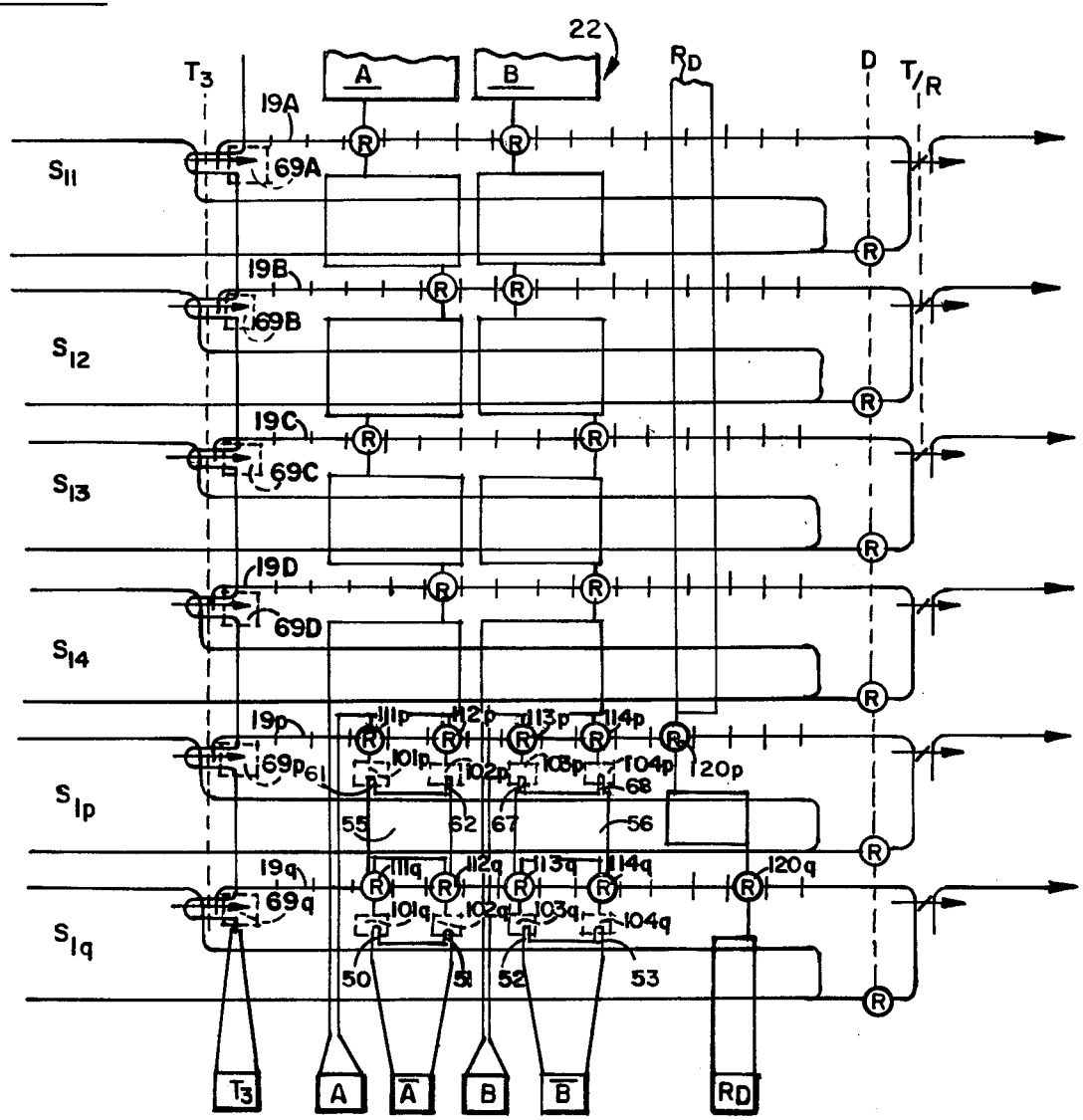
FIG. 4 is a diagram illustrating another embodiment of output decoder utilized in the instant invention.

Referring now to FIG. 4, there is shown a specific arrangement of the decoder element which may be used to provide redundancy in decoder 22. As in the preceding figures, the propagation paths 19A through 19D are shown. In addition, redundant paths 19P and 19Q are provided. These propagation paths comprise the typical chevron columns and are associated with storage loops S11-S14 and redundant storage loops $5_{1P}$ and $5_{1Q}$ via switch T3 (see also FIG. 2). In this embodiment, the conductor associated with switches T3 is connected to pad T3 (where signal T3 is applied). In addition, in this embodiment decoder 22 includes wide signal conductors connected to pads A, $\overline{A}$, B, $\overline{B}$ and RD to receive the signals A, $\overline{A}$, B, $\overline{B}$ and RD, respectively. The other end of the conductor lines are connected together to a common reference point, for example ground potential (not shown). Typically, the decoder lines include portions of the narrow conductors which are adjacent (e.g. overlay) ends of chevron columns, as shown, for use as retarder elements.

In this embodiment, controller 50 (not shown) produces signals which are unipolar but spaced apart in time. Thus, signal A represents, for example, a pulse (such as a current pulse) from controller 50 to pad A at time slot 1 (see FIG. 3). Conversely, the signal $\overline{A}$ represents a signal, or current pulse, from controller 50 to pad $\overline{A}$ at time slot 3. Likewise, signals B and $\overline{B}$ can be applied to pads B and $\overline{B}$ at time slot 1 and 3, respectively.

As noted, retarders 79, 80, etc. are conductors which are offset from each other relative to the signal conductors and the propagation paths. The offset portions thus establish magnetic fields (when pulsed) adjacent specified ends of chevron columns. Depending upon the timing of the signals and the end of the chevron column to which the conductor is adjacent, bubbles may be selectively retarded.

The purpose of including paths 19P and 19Q is to permit redundant rows to be placed on a chip during fabrication. Thus, if one or two of the propagation paths 19A-D are defective, one or two redundant rows can be used and the chip need not be a total loss. Of course, if more rows are defective than there are redundant rows the chip is discarded.

Redundant paths 19P and 19Q have associated therewith portions of conductors related to pads $\overline{A}$ and $\overline{B}$. It is noted that pads $\overline{A}$ and $\overline{B}$ are somewhat Y-shaped, i.e. wider at the top than at the bottom. The wide top permits pads $\overline{A}$ to provide "ears" 50 and 51 and pad $\overline{B}$ to provide "ears" 52 and 53, respectively. The size of these ears is not critical, so long as a contact can be effected at the respective pad. Somewhat H-shaped conductor elements 55 and 56 are formed between redundant rows R1 and R2. The legs of the H-shaped elements are aligned with the ears of pads $\overline{A}$ and $\overline{B}$ as well as the retarder components in the conductor paths. The conductor paths typically include the relatively wide conductor and the narrow retarder as shown and described supra. Each of the wide conductor elements is joined to the next adjacent conductor elements via one of the retarder components whereby the decoder is formed. However, the narrow legs of H-shaped elements 55 and 56 as well as the ears of pads $\overline{A}$ and $\overline{B}$ are normally disconnected.

In the event that there is a defective propagation path in decoder 22 (or a defective storage loop), one (or more) of the redundant rows are activated to replace the defective row. The activation is performed in a relatively simple manner. That is, one or more of the areas 61 through 68 shown in dashed outline are operated upon to form an interconnection. The interconnection is formed by first etching out a portion of the $SiO_2$ insulating layer which is frequently deposited over the conductors on the chip. A layer of metallization is then deposited on the chip, including the apertures or "windows" in the $SiO_2$ layer. This layer of metallization forms a contact with and connection between the conductor portions uncovered when the $SiO_2$ is removed. (Of course, the remainder of this metallization layer is then also removed).

By properly defining the pattern of windows and, thus, connections, the defective propagation path can be replaced. For example, if an A aligned conductor (or retarder component) is desired, the connection at area 61 is formed, thereby providing a retarder component adjacent row R1 is provided. Of course, area 62 is not formed into a connector. In addition, areas 63 or 64, or both, are also formed into connections to permit control signals to be applied to the conductor. Of course, operating at area 62, instead of area 61, produces an $\overline{A}$ aligned retarder-conductor. Likewise, areas 67 and 68 can be operated upon to provide B or $\overline{B}$ aligned conductor arrangements.

Moreover, if two redundant rows are required the operations will take place on areas 50 through 53 in a manner similar to that noted above.

It should be understood, that actions must be taken relative to transfer switch T3, also, For example, an area, e.g. area 69, must also be connected in order to short out the particular transfer switch associated with the defective row. In the configuration shown, no action is required relative to the transfer switches associated with redundant rows R1 and R2. Of course, transfer switches T3 can be constructed such that a positive operation, similar to that described above, is required to activate same.

Of course, other implementation of the decoder can be made. For example, the correction can be made by etching away areas included on the original chip instead of adding new conductors. Also, the complementary decoders can be connected in parallel prior to etching. In either event, the individual registers can be tested for defects. When defects are identified, the redundant loop can be modified as noted above.

Also, the correction can be implemented by the insertion of an additional retarding switch in the decoder loop. This additional switch can be activated to retard bubbles in the decoder so that they are out of sync and cannot be detected. This approach is similar in effect to the removal of the transfer switch T3 from the defect loops.

Thus, there is shown and described a preferred embodiment of an on-chip decoding circuit organization. In this organization, the bubble domains produced by the generator are in turn replicated into new bubble domains and rapidly supplied to any number of propagation paths utilized in the organization. A significant advantage of this chip organization is the reduction in number of generators required thereby substantially reducing the necessity of large quantities of power to nucleate bubbles. Any interchangeable devices, components or elements may be utilized in this organization without departing from the invention concept. Thus, this scheme is not dependent upon specific components, elements or devices. Moreover, it may be understood that this chip organization can be achieved with so-called two-level, one and one half level or even one level processing with appropriate choice of components and configuration. This description is intended to be illustrative only and not limitative. The scope of this invention is intended to be limited only by the claims appended hereto.

Having thus described a preferred embodiment of the invention, what is claimed is:

1. A device for operating on magnetic bubble domains comprising:
   generator means for selectively producing bubble domains;
   replicator means for splitting said domains from said generator means into a plurality of new domains;
   storage means comprising at least one storage loop for storing and recirculating domains;
   input decoder means for selectively transferring said new domains from said replicator means to said storage means;
   detector means for detecting said domains;
   output decoder means for decoding said domains to be transferred from said storage means to said detector means; and
   switch means associated with said storage means for selectively transferring said domains between said storage means and said detector means via said decoding means;
   said output decoder means comprising at least one propagation path connected in parallel with a portion of said storage loop in said storage means.

2. The device recited in claim 1 including a magnetic sheet having paths in which said domains can be propagated; and
   means for applying magnetic fields thereto to support and move said domains.

3. The device recited in claim 1 wherein
   said output decoder means includes at least one retarder means for retarding the propagation of domains therethrough.

4. The device recited in claim 1 wherein, said storage means comprises a plurality of separate storage loops, and
   said switch means comprises a plurality of switches interconnected for simultaneous operation,
   each of said switches associated with a separate respective storage loop.

5. The device recited in claim 1 including, control means for supplying control signals to each of the recited components in order to selectively activate same.

6. The device recited in claim 1 wherein said generator means, said replicator means, said input decoder means, said output decoder means, and said switch means are coupled together by a common propagation path for propagating said bubble domains.

7. The device recited in claim 1 wherein
   said propagation path in said output decoder means is shorter than the parallel portion of said storage loop in said storage means.

8. The device recited in claim 1 wherein,
   said switch means includes at least one transfer switch for selectively transferring domains from said storage means to said output decoder propagation path.

9. The device recited in claim 8 including
   merge means for connecting said output decoder propagation path to said storage means.

10. The device recited in claim 9 including
    retarder means in one of said output decoder propagation paths to synchronize the domains propagating therealong.

11. The device recited in claim 8 wherein,
    said switch means includes a further switch means for selectively transferring domains from said output decoder propagation path to said detector means.

12. The device recited in claim 1 wherein,
    said output decoder means includes at least one conductor disposed adjacent to and crossing said propagation path, said conductor including at least one portion thereof adapted to apply a magnetic field to selectively retard magnetic bubble domains in response to the application of a current signal to said conductor.

13. The device recited in claim 12 wherein, said conductor includes portions thereof which are offset relative to each other so as to concurrently apply a magnetic field to different portions of said propagation paths whereby domains are retarded in only some portions of said propagation paths.

14. The device recited in claim 13 wherein each of said portions of said conductor is relatively narrower than the remainder of said conductor.

15. The device recited in claim 1 including
    at least one redundant path comprising a storage loop and an output decoder propagation path,
    conductors associated with said redundant path to provide coding and decoding functions, and
    at least portions of said conductors being alterable to control said coding and decoding functions.

16. The device recited in claim 15 wherein
    said portions of said conductors are alterable by addition of further conductor material to close an open circuit portion thereof.

* * * * *